(12) United States Patent
Wierzbicki et al.

(10) Patent No.: US 7,362,572 B1
(45) Date of Patent: Apr. 22, 2008

(54) TECHNIQUES FOR REDUNDANT COMPUTING WITHIN A 1U FORM FACTOR WITH IMPROVED RESOURCE PARTITIONING AND MANAGEMENT

(75) Inventors: Robert P. Wierzbicki, Worcester, MA (US); Thomas J. Connor, Jr., Winchendon, MA (US); Ralph C. Frangioso, Jr., Franklin, MA (US); Paul H. Maier, Jr., Athol, MA (US); Matthew Borsini, Northborough, MA (US); Darrin Haug, Bellingham, MA (US)

(73) Assignee: EMC Corporation, Hopkinton, MA (US)

( * ) Notice: Subject to any disclaimer, the term of this patent is extended or adjusted under 35 U.S.C. 154(b) by 414 days.

(21) Appl. No.: 11/092,039

(22) Filed: Mar. 29, 2005

(51) Int. Cl.
*H05K 7/20* (2006.01)

(52) U.S. Cl. .................. 361/695; 361/716; 174/16.1

(58) Field of Classification Search ............... None
See application file for complete search history.

(56) References Cited

U.S. PATENT DOCUMENTS

| | | | |
|---|---|---|---|
| 4,748,560 A | 5/1988 | Kataoka | |
| 6,411,535 B1 | 6/2002 | Roux | |
| 6,459,571 B1 * | 10/2002 | Carteau | 361/684 |
| 6,563,706 B1 * | 5/2003 | Strickler | 361/695 |
| 6,583,989 B1 | 6/2003 | Guyer et al. | 361/724 |
| 6,621,692 B1 | 9/2003 | Johnson et al. | 361/683 |
| 6,628,513 B1 | 9/2003 | Gallagher et al. | |
| D486,494 S | 2/2004 | Gundogan et al. | D14/444 |
| 6,725,302 B1 | 4/2004 | Benayoun et al. | |
| 6,747,878 B1 * | 6/2004 | Hipp et al. | 361/801 |
| 6,751,094 B2 * | 6/2004 | Kolb et al. | 361/687 |
| 6,762,362 B1 | 7/2004 | Cavanaugh et al. | 174/68.2 |
| 6,771,499 B2 * | 8/2004 | Crippen et al. | 361/687 |
| 6,785,133 B2 * | 8/2004 | Barringer et al. | 361/694 |
| 6,785,142 B1 * | 8/2004 | Regimbal et al. | 361/727 |
| D496,050 S | 9/2004 | Gundogan et al. | D14/444 |
| 6,789,206 B1 | 9/2004 | Wierzbicki et al. | 713/300 |
| 6,826,456 B1 * | 11/2004 | Irving et al. | 700/299 |
| 6,850,410 B2 | 2/2005 | Peeke et al. | 361/685 |
| 6,909,052 B1 | 6/2005 | Haug et al. | 174/255 |
| 6,924,977 B2 | 8/2005 | Bestwick et al. | 361/687 |
| 6,924,986 B1 | 8/2005 | Sardella et al. | 361/785 |
| 6,943,463 B2 | 9/2005 | Goerke et al. | |

(Continued)

OTHER PUBLICATIONS

U.S. Appl. No. 11/092,535, filed Mar. 29, 2005, Frangioso, Jr. et al.

*Primary Examiner*—Boris Chervinsky
(74) *Attorney, Agent, or Firm*—Bainwood Huang

(57) ABSTRACT

An improved redundant computing apparatus includes a chassis assembly configured to (i) mount to a standard electronic equipment rack and (ii) consume substantially 1U of space in a particular direction (e.g., vertical height) within the standard electronic equipment rack. The chassis assembly includes a housing and a midplane disposed within the housing. The apparatus further includes a set of power supply/blower assemblies configured to connect to the midplane of the chassis assembly through a front of the housing in a field replaceable manner, and a set of computing devices configured to connect to the midplane of the chassis assembly through a back of the housing in a field replaceable manner. By way of example, the set of computing devices is adapted to move data into and out of a set of disk drives on behalf of a set of external host computers.

17 Claims, 4 Drawing Sheets

U.S. PATENT DOCUMENTS

| | | |
|---|---|---|
| 6,980,427 B2 | 12/2005 | Garnett et al. .............. 361/685 |
| 7,039,737 B1 | 5/2006 | Dorr et al. |
| 7,139,170 B2 * | 11/2006 | Chikusa et al. ............. 361/695 |
| 7,154,723 B1 | 12/2006 | Warnakulasooriya et al. |
| 7,193,845 B2 * | 3/2007 | Titus .......................... 361/685 |
| 2006/0061955 A1 * | 3/2006 | Imblum ...................... 361/685 |

* cited by examiner

US 7,362,572 B1

TECHNIQUES FOR REDUNDANT COMPUTING WITHIN A 1U FORM FACTOR WITH IMPROVED RESOURCE PARTITIONING AND MANAGEMENT

BACKGROUND

A typical data storage system includes data moving circuitry and an array of disk drives. Some data storage systems fit within standard-sized equipment cabinets or racks. The data moving circuitry for such data storage systems is typically fashioned into modules called blade servers, or simply blades, which are housed (perhaps in pairs) within enclosures. Such enclosures are commonly available in a variety of standard heights (e.g., 4U, 3U, 2U and 1U, where U is a standard measure of vertical height in the equipment cabinet and is equal to 1.75 inches in accordance with the EIA-310-D industry standard).

One conventional enclosure (hereinafter referred to as the conventional 4U enclosure) includes a 4U chassis, a midplane, two independent blades, two dual-port power supplies, and three pairs of fans. The midplane sits in the middle of the 4U chassis. The two blades independently plug into the midplane through a rear opening of the 4U chassis and reside in a stacked manner within the 4U chassis, one above the other. Similarly, the dual-port power supplies independently plug into the midplane through the rear opening of the 4U chassis and straddle the two blades along the sides of the 4U chassis. In particular, a rightside power supply sits right side up within the 4U chassis, and a leftside power supply sits upside down within the 4U chassis, thus enabling the manufacturer to connect both dual-port power supplies to the midplane while maintaining a single dual-port power supply design for the 4U chassis. One power cord to each dual port power supply plugs into the rear face of the power supply through an IEC-C14 appliance coupler mounted on each power supply. Additionally, each pair of fans plugs into the midplane through a front opening of the 4U chassis.

During operation, the midplane carries DC power supply signals from the two dual-port power supplies to the three pairs of fans and to the two blades (i.e., a first port of each dual-port power supply outputs power supply signals to one blade and a second port of each dual-port power supply outputs power supply signals to the other blade). The power for both the fans and the blades is diode-OR'd or shared to support backup of each other in the event of one DC power supply failing. Each blade of the 4U enclosure typically includes two microprocessors and performs data storage operations. For example, each blade stores data into and retrieves data from an adjacent array of disk drives on behalf of one or more external host computers. The three pairs of fans pass air over the blades in a shared configuration to thermally maintain the blades within a controlled temperature range.

If a component fails while the 4U enclosure is running, a technician typically can perform a hot swapping procedure to replace the failed component without completely powering down the 4U enclosure. For example, when the 4U enclosure loses a fan, the technician may need to replace a pair of fans having both the failed fan as well as an associated good fan thus placing the system into a further degraded mode until a repair is made. As a result, the 4U enclosure responds by transitioning from a normal operating mode in which the 4U enclosure performs data storage operations to a cache saving mode in which the 4U enclosure no longer performs data storage operations but instead writes the contents of cache memory out to the disk drive array. If the technician is successful in replacing the pair of fans within a two minute span (i.e., the length of operating time that can be sustained by its battery backup system), the 4U enclosure can transition back to the normal operating mode without ever shutting down completely. However, if the technician is unsuccessful in replacing the pair of fans within the two minute span, the 4U enclosure powers down safely and reliably so that no data is lost thus enabling the technician to restart the 4U enclosure at a later time.

Another conventional enclosure (hereinafter referred to as the conventional 1U enclosure) includes a 1U chassis, a single blade, two power supplies, two IEC-C14 appliance couplers, and an assembly of fans. Here, the single blade of the 1U enclosure includes two microprocessors, and resides on a motherboard which is rigidly fixed to the 1U chassis. If the blade fails, a technician simply replaces the entire 1U chassis.

SUMMARY

Unfortunately, there are deficiencies to above-described conventional enclosures. For example, in connection with the above-described conventional 4U enclosure, the amount of space consumed within the equipment cabinet is relatively large vis-à-vis 1U enclosures. Accordingly, such conventional 4U enclosures do not make very efficient use of space and thus preclude other components from occupying the equipment cabinet (e.g., more disk drives).

Additionally, in connection with the above-described conventional 1U enclosure, the space limitations with the conventional 1U chassis do not permit robust field replaceability such as the ability to have all blades independently field replaceable and/or hot swappable. Rather, a technician must replace the entire 1U enclosure if any one of the blades fails. Furthermore, each blade of the 1U enclosure typically includes one or two microprocessors thus severely limiting the amount of throughput and fault tolerance capabilities provided by each blade of the 1U enclosure.

In contrast to the above-described conventional enclosures, an improved redundant computing apparatus includes a 1U chassis (i.e., a chassis assembly having a 1U form factor) and a particular configuration of components within the 1U chassis which enables the components to be less complex as well as enjoy robust field replaceability (e.g., each computing device and each power supply/blower assembly is hot swappable from the 1U chassis). Along these lines, an improved midplane enables enhanced resource partitioning and optimizations. For example, power supply/blower assemblies can be simpler and less expensive hot-swappable single-port units (rather than dual-port devices) which work together to provide redundancy for each computing device. Moreover, the computing devices can be high-power, high-speed Intel Architecture circuits (e.g., IA32 compliant processors and chipsets) with robust front-to-back thermal cooling airflow that complies with de-facto industry norms for effective intermixing in different racks with other equipment rather than adversely affecting the operation of such other equipment. Furthermore, the apparatus is capable of being equipped with two independent power source cables (e.g., AC line cords) which are configured to respectively connect to two independent power sources for power distribution from each power source to each computing device (e.g., interleaved power partitioning through an array of four power supplies) for enhanced fault tolerance.

One embodiment is directed to an apparatus for controlling a set of disk drives. The apparatus includes a chassis assembly configured to (i) mount to a standard electronic equipment rack and (ii) consume substantially 1U of space in a particular direction (e.g., vertical height) within the standard electronic equipment rack. The chassis assembly includes a housing and a midplane disposed within the housing. The apparatus further includes a set of power supply/blower assemblies configured to connect to the midplane of the chassis assembly through the front of the housing in a field replaceable manner, and a set of computing devices configured to connect to the midplane of the chassis assembly through a back of the housing in a field replaceable manner. The set of computing devices is adapted to move data into and out of the set of disk drives on behalf of a set of external host computers.

Preferably, the midplane is formed of circuit board material (i.e., layers of conductive and non-conductive material sandwiched together), and is configured to simultaneously carry both AC signals and DC signals. Accordingly, the midplane is particularly well-suited for distributing AC power supply signals to the power supply/blower assemblies, as well as distributing DC power supply signals from the power supply/blower assemblies to the set of computing devices.

BRIEF DESCRIPTION OF THE DRAWINGS

The foregoing and other objects, features and advantages of the invention will be apparent from the following description of particular embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION

An improved redundant computing apparatus includes a 1U chassis (i.e., a chassis assembly with a 1U form factor for efficient use of vertical space) and a particular configuration of components within the 1U chassis which enables the components to be less complex as well as enjoy robust field replaceability (e.g., each computing device and each power supply/blower assembly is hot swappable from the 1U chassis). Along these lines, power supply/blower assemblies can be simpler and less expensive hot-swappable single-port units which work together to provide redundancy for each computing device. Moreover, the computing devices can be high-power, high-speed Intel® Architecture circuits (e.g., IA32 compliant processors and chipsets).

Figure 1:
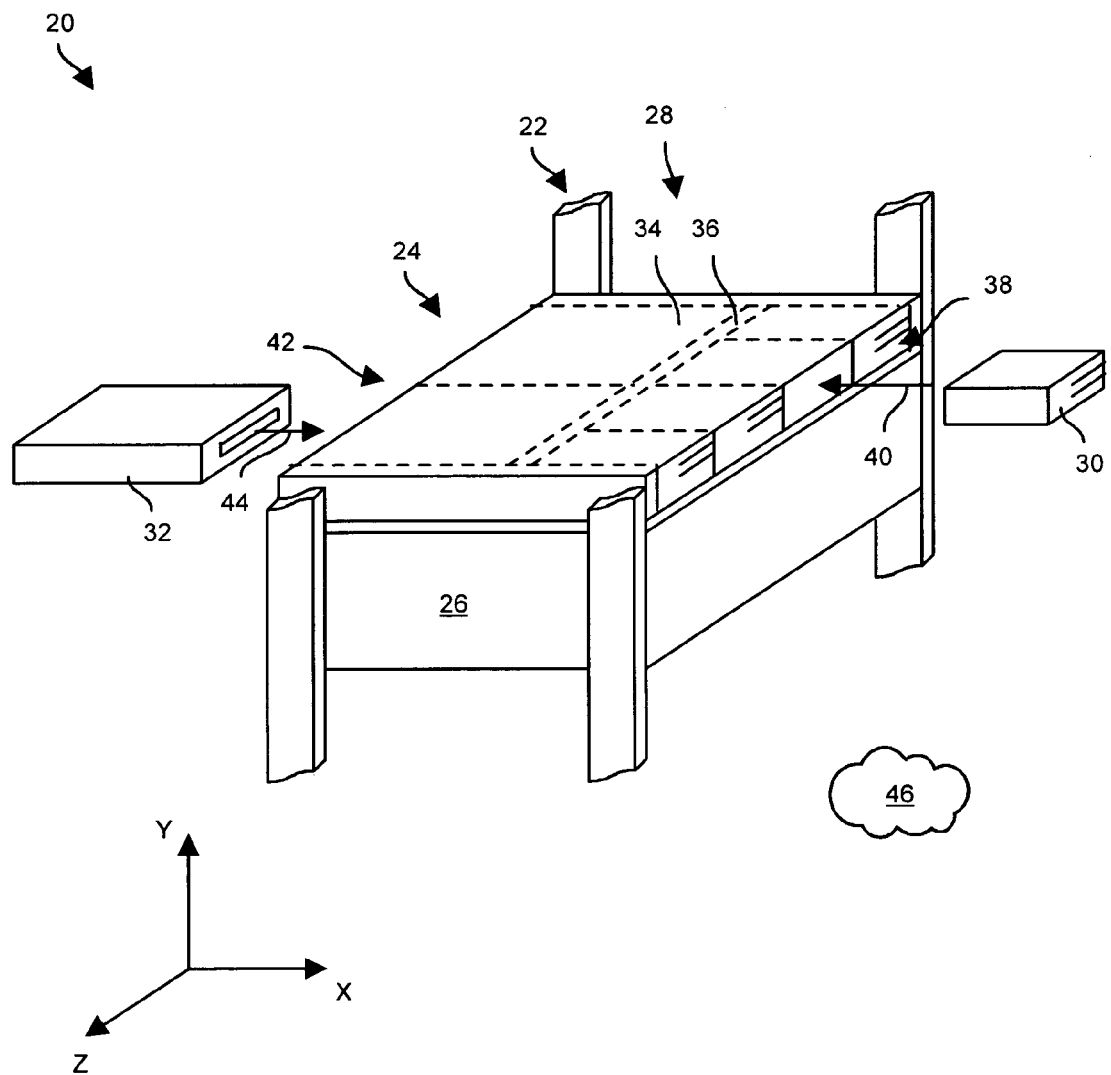
FIG. 1 is a perspective view of a rack system having an improved apparatus for redundant computing.

FIG. 1 shows a perspective view of a rack mount data storage system 20 having a standard electronic equipment rack 22 (e.g., cutaway portions of vertical rails for a standard 19-inch cabinet are shown for illustration purposes), an improved disk drive control apparatus 24 and an array of disk drives 26. The improved disk drive control apparatus 24 includes a chassis assembly 28, a set of power supply/blower assemblies 30 (i.e., one or more power supply/blower assemblies 30) and a set of computing devices 32 (i.e., one or more computing devices 32). The chassis assembly 28 is configured to (i) mount to the electronic equipment rack 22 and (ii) consume substantially 1U of space in a particular direction (e.g., the Y-direction). The rack 22 is capable of supporting additional rack-mount components above and/or below the components 24, 26 (e.g., additional apparatus 24, more disk drives 26, network adapters, etc.).

As further shown in FIG. 1, the chassis assembly 28 includes a housing 34 and a midplane 36 disposed within the housing 34 (the location of the midplane 36 is illustrated by dashed lines along the Z-axis in FIG. 1). Each power supply/blower assembly 30 is configured to independently connect to the midplane 36 of the chassis assembly 28 through a front 38 of the housing 34 in a field replaceable manner (also see the arrow 40). That is, each power supply/blower assembly 30 is considered to be a field replaceable unit (FRU) because it is packaged in a modularized manner easy connection and disconnection from the midplane 36 when simply sliding toward or away from the midplane 36. Similarly, each computing device 32 is configured to independently connect to the midplane 36 of the chassis assembly 28 through a back or rear 42 of the housing 34 in a field replaceable manner (also see the arrow 44).

By way of example only, the array of disk drives 26 has a height of substantially 3U's, and the improved disk drive control apparatus 24 mounts to the equipment rack 22 above the array of disk drives 26. During operation, the set of computing devices 32 obtains power and cooling from the set of power supply/blower assemblies 30, and accesses the array of disk drives 26 (i.e., moves data into and out of the array of disk drives 26) on behalf of a set of external host computers (shown generally in FIG. 1 by the reference numeral 46). In particular, each computing device 32 is equipped with cache memory in order to perform a variety of data storage operations such as write-back caching, write-through caching, read caching and read ahead prefetch caching during normal operation.

It should be understood that the improved disk drive control apparatus 24 is capable of alternatively mounting to the rack 22 below the disk drive array 26. Moreover, it should be understood that both the control apparatus 24 and the disk drive array 26 of the data storage system 20 are shown as being completely housed within the rack 22 by way of example only. Other configurations are suitable for use as well such as distributed configurations in which the control apparatus 24 and the disk drive array 26 reside in different cabinets.

Furthermore, it should be understood that the improved disk drive control apparatus 24 is well-suited for operating in the context of a storage area network (SAN) environment (i.e., the computing devices 32 are "storage processors" operating over a private Fibre Channel network) or, alternatively, in a network attached storage (NAS) environment (i.e., the computing devices 32 are "data movers" operating over a standard network). In either situation, computing circuitry within the disk drive control apparatus 24 is configured to robustly perform data storage operations (i.e., move and cache data) on behalf of the external host computers 46. Further details will now be provided with reference to FIG. 2.

Figure 2:
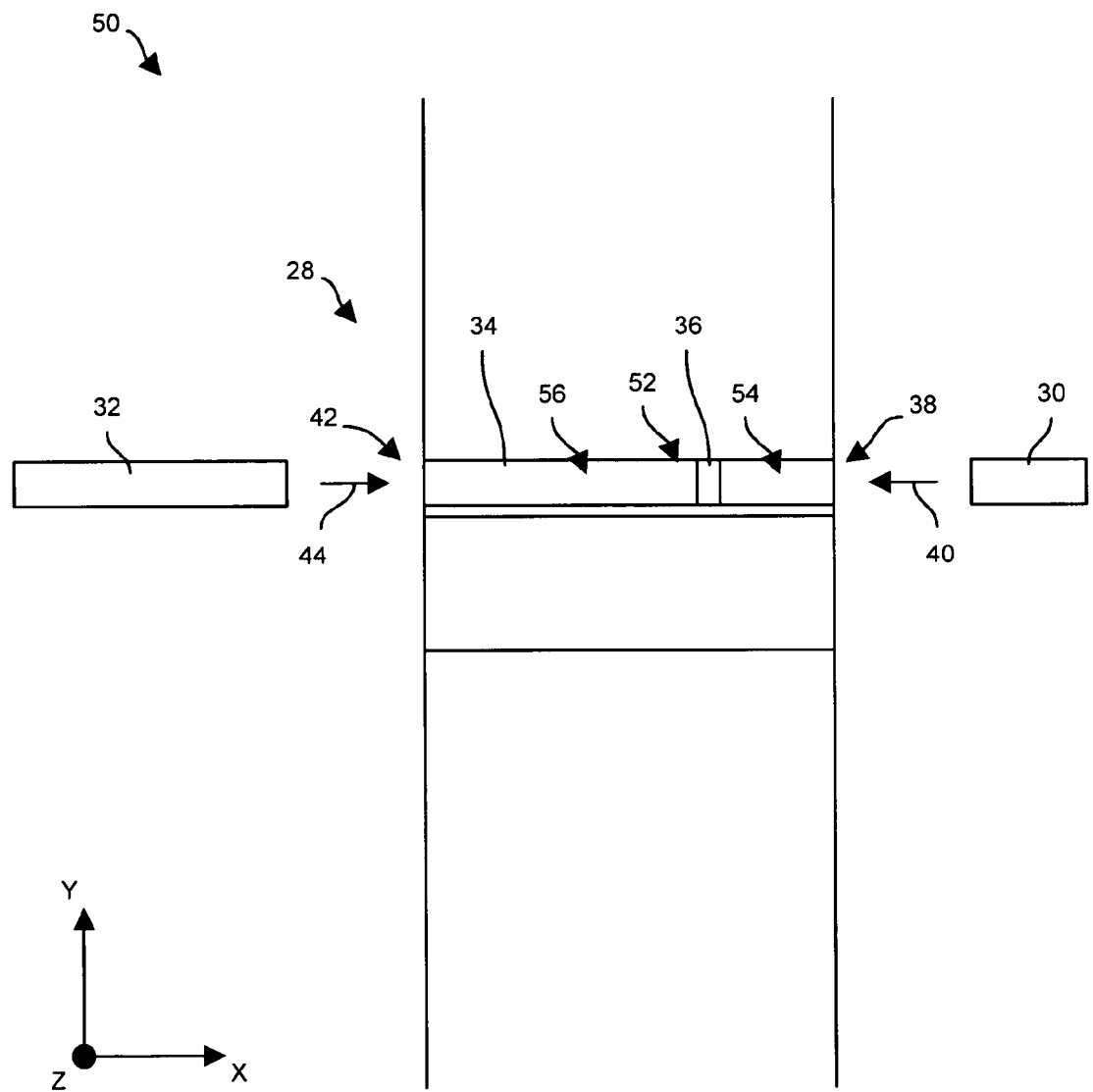
FIG. 2 is a side view of the rack mount system of FIG. 1.

FIG. 2 is a side view 50 of the rack mount data storage system 20. The midplane 36 divides a space 52 within the housing 34 into a front region 54 and a rear region 56. Each power supply/blower assembly 30 is capable of connecting to the midplane 36 (also see the arrow 40) and disconnecting from the midplane 36 through the front opening 38 in a hot swappable manner (i.e., while all other components connected to the midplane 36 have access to live electric signals). In particular, a user simply engages or disengages connectors of the power supply/blower assembly 30 by sliding the assembly 30 through an available slot in the front region 54 in a blind mating or blind de-mating manner.

Similarly, each computing device 32 is capable of connecting to the midplane 36 (also see the arrow 44) and disconnecting from the midplane 36 through the rear opening 42 of the 1U chassis assembly 28 in a hot swappable manner. Again, a user simply engages or disengages connectors of the computing device 32 by sliding the device 32 through an available slot in the rear region 54 in a blind mating or blind de-mating manner.

In view of the above-described ease of use in connecting and disconnecting the component 30, 32 in combination with the optimal 1U height of the chassis assembly 28, one will appreciate that the apparatus 26 provides robust optimal field replaceability in an ideal form factor. That is, the apparatus 24 does not suffer from an inability to independently hot swap data moving circuitry as in a conventional 1U enclosure which has blades rigidly affixed to a common chassis. Additionally, the apparatus 24 does not suffer from a sub-optimal use of space as in a conventional 4U enclosure. Further details of the invention will now be provided with reference to FIG. 3.

Figure 3:
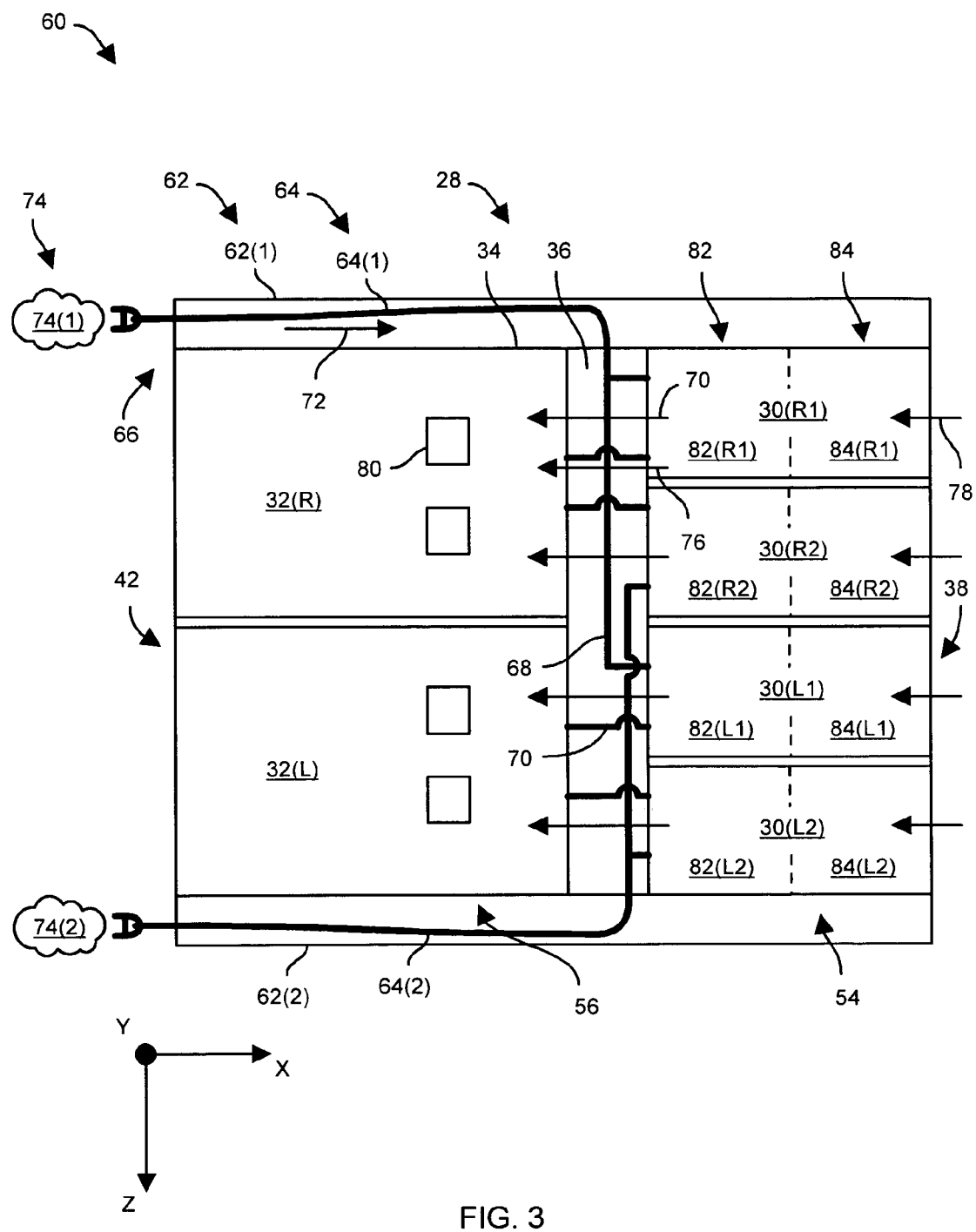
FIG. 3 is a top view of the redundant computing apparatus of the rack mount system of FIG. 1.

FIG. 3 is a top view 60 of the improved disk drive control apparatus 24 of the system 20. From this perspective, one will be able to appreciate various advantages provided by the apparatus 24 as will now explained in further detail. As shown in FIG. 3, the chassis assembly 28 further includes a set of rails 62 and a set of power supply cables 64. The rails 62 are configured to fasten the housing 34 to the electronic equipment rack 22 (FIG. 1), i.e., one rail 62(1) mounts the housing 34 to the righthand side of the rack 22 and another rail 62(2) mounts the housing 34 to the lefthand side of the rack 22. Additionally, the rails 62 respectively carry the power supply cables 64 in a manner that keeps the power supply cables 64 well-protected (e.g., against being inadvertently pulled and against damage) and clear of the rear opening 42. That is, the rails 62 operate as cable guides which laterally position the power supply cables 64 along the outer periphery 66 of the computing devices 32, thus enabling a user to maneuver the computing devices 32 through the rear opening 42 of the housing 32 without being hindered by the power supply cables 64. The computing devices 32 reside together in the back region 56 of the housing 34 in a side-by-side manner within respective isolated air flow pathways in order to fit within the 1U form factor as well as take advantage of self contained redundant cooling capabilities of two of the four power supply/blower assemblies 30.

The above-described arrangement of the midplane 36 and cables 64 which connect to the side edges of the midplane 36 provides the added advantage of not having the cables 64 hinder air flow through the housing 34. That is, there are no IEC-C14 appliance couplers required as part of the system 20. Line cords do not cross over critical air flow paths within the housing 34 or even externally at either the front or the rear, thus maximizing air flow and allowing higher wattage devices within the housing 34 to be thermally kept within spec. In contrast, conventional enclosures typically suffer by having AC line cords extend through the chassis which can substantially block air flow.

Additionally, the midplane 36 is a circuit board having a set of AC power supply traces 68 as well as a set of DC power supply traces 70. The set of AC power supply traces 68 carries a set of AC power supply signals 72 from a set of external power sources 74 to the set of power supply/blower assemblies 30. The set of DC power supply traces 70 carries a set of DC power supply signals 76 from the set of power supply/blower assemblies 30 to the set of computing devices 32.

It should be understood that the traces 68, 70 of the midplane 36 (e.g., layers of copper etch, copper planes, etc.) permit convenient placement of circuit board components (e.g., midplane connectors, power conditioning components, signal isolation components, etc.) and convenient routing of signals thus resolving many resource management conflicts that exist in conventional enclosures. For example, the midplane 36 is capable of including circuit board connectors which connect to ports of the power supply/blower assemblies 30. These circuit board connectors preferably are positioned in a uniform and distributed manner enabling all of the power supply/blower assemblies 30 to reside in a single row in the same orientation. That is, the power supply/blower assemblies 30 do not need to reside in flipped and un-flipped orientations which can be confusing to the user as in conventional enclosures. Rather, all of the power supply/blower assemblies 30 are capable of residing right-side-up. Similarly, the computing devices 32 do not need to reside in flipped and un-flipped orientations, but instead are all capable of residing right-side-up. Moreover, since the midplane 36 carries AC power supply signals 72, there no need for separate power supply cords for each power supply/blower assembly 30 as in some conventional blade systems.

Additionally, the four power supply/blower architecture alleviates the need to use relatively expensive and complex dual-ported power supplies as in conventional enclosures. Rather, the power supply/blower assemblies 30 are capable of including simple and lower-cost, single-port power supplies which exclusively power respective computing devices 32. This feature will be discussed in further detail shortly.

Furthermore, the midplane 36 provides a low profile which does not substantially obstruct airflow through the housing 34. Rather, the midplane 36 provides abundant clearance between the front region 54 and the back region 56 of the housing 34 (also see FIG. 2). In some arrangements, the midplane circuit board 36 is oriented (horizontal) to the air flow within the housing 34 where copper etches then carry the AC power supply signals to the power supply/blower assemblies 30 thus providing a much thinner orientation to that air flow than AC line cords. This arrangement maximizes that air flow. Accordingly, the power supply/blower assemblies 30 are capable of moving a significant amount of air (see the arrows 78) from the front opening 38 to the rear opening 42 through the housing 34. As a result, each computing device 32 is capable of employing multiple high-speed, high-power microprocessors 80 (e.g., IA32 processors which are 50 Watts or higher), and the power supply/blower assemblies 30 can easily maintain an optimal operating temperature range (e.g., 10 to 40 degrees Celsius) within the housing 34. In some arrangements, the power consumption of each processor on each computing device 32 is greater than 50 Watts (e.g., 55 Watts). Such a data moving configuration (e.g., dual-dual IA32 processor chipsets with server level, field replaceable memory) permits high bandwidth and robust fault tolerance within an extremely small 1U form factor. The operation of the power supply/blower assemblies 30 will now be discussed in further detail.

As shown in FIG. 3, there are exactly two computing devices 32, namely, a righthand computing device 32(R) and a lefthand computing device 32(L). Additionally, there are exactly four power supply/blower assemblies 30(R1), 30(R2), 30(L1) and 30(L2) (collectively power supply/blower assemblies 30). Each power supply/blower assembly 30 includes a power supply 82 and a blower (or fan) 84. That is, the power supply/blower assembly 30(R1) includes a power supply 82(R1) and a blower 84(R1). Similarly, the power supply/blower assembly 30(R2) includes a power supply 82(R2) and a blower 84(R2), and so on.

The pair of power supply/blower assemblies 30(R1), 30(R2) provides power exclusively to the computing device 32(R) with N+1 redundancy. Accordingly, if one of the power supply/blower assemblies 30 fails (e.g., the power supply/blower assembly 30(R1)), the computing device 32(R) continues operation by receiving power from the remaining power supply/blower assembly 30 (e.g., the power supply/blower assembly 30(R2)). Similarly, the pair of power supply/blower assemblies 30(L1), 30(L2) provides power exclusively to the computing device 32(L) with N+1 redundancy.

Preferably, each power supply 82 has enough power capacity to power one computing device 32 and two blowers 84. In one arrangement, each computing device 32 consumes a maximum of 240 Watts of power, each blower 84 consumes a maximum of 10 Watts of power, and each power supply is capable of providing 260 Watts of power. Accordingly, if a power supply 82 to a particular computing device 32 were to fail, the remaining power supply 82 would be able to provide power to that computing device 32 and the two blowers in front of that computing device 32 indefinitely. Thus, even though the power supply 82 of a power supply/blower assembly 30 fails, the blower 84 of that assembly 84 is capable of remaining operational.

For example, suppose that the power supply 82(R2) failed. The computing device 32(R) and the blowers 84(R1), 84(R2) of the power supply/blower assemblies 30(R1), 30(R2) would continue to operate fully using power from the remaining power supply 82(R1). Furthermore, the computing device 32(L) and the blowers 84(L1), 84(L2) are completely unaffected since they are powered by the power supplies 82(L1), 82(L2) of the power supply/blower assemblies 30(L1), 30(L2).

It should be understood that the power supplies 82 of the power supply/blower assemblies 30 receive power from multiple external power sources 74(1), 74(2) in an interleaved manner for enhanced fault tolerance. That is, the power supplies 82(R1), 82(L1) receive power through the power supply cable 64(1) within the rail 62(1) from the external power source 74(1). Similarly, the power supplies 82(R2), 82(L2) receive power through the power supply cable 64(2) within the rail 62(2) from the external power source 74(2). Accordingly, if one of the external power sources 74(1), 74(2) were to fail or if one of the power supply cords 64 were to fail, both computing devices 32 would continue to receive power for maximum availability.

It should be understood that the above-described configuration of the apparatus 24 provides simplicity and certain efficiencies. For example, the configuration alleviates the need to use relatively expensive and complex dual-ported power supplies as in a conventional 4U enclosure which achieves power supply fault tolerance with two power supplies for two blades. Rather, in the apparatus 24, the power supplies 82 have single output ports since each supply 82 exclusively powers only one computing device 32. Furthermore, the power supplies 82 respectively provide simple electrical isolation (e.g., using diodes) between themselves thus avoiding corruption of the computing devices 32 during a power supply failure. As a result, the supplies 82 are simple and less costly.

Nevertheless, as mentioned earlier, robust fault tolerant redundancy exists for each computing device 32. That is, if one of the power supplies 82(R1), 82(R2) were to fail, the computing device 32(R) will continue to receive power and cooling from the remaining power supply 82(R1), 82(R2). Similarly, if one of the power supplies 82(L1), 82(L2) were to fail, the computing device 32(L) will continue to receive power and cooling from the remaining power supply 82(L1), 82(L2). Accordingly, the use of four relatively smaller power supplies 80 provides smarter resource management than conventional schemes which use fewer, but more-complex power supply units.

It should be further understood that the blowers 82 of the power supply/blower assemblies 30 provide sufficient cooling capacity, even in the event of blower failure, to enable the computing devices 32 to utilize high-end, high-power processors. For example, suppose that the blowers 84(R1), 84(L1) were to fail due to the loss of the external power source 74(1). The remaining blowers 84(R2), 84(L2) are equipped to provide sufficient airflow through the housing 34 to maintain four high-speed processors (e.g., IA32 compliant microprocessors) for an indefinite amount of time and thus sustain continued operation of both computing devices 32. Preferably, the processors 80 are equipped with highly efficient heat sinks and are distributed so as to be well-exposed to the airflow of each blower 80.

Based on the above-described management of resources within the apparatus 24, it should be understood that there is no need to stop the apparatus 24 from operating in a write-back caching mode in the event of a single power supply failure. That is, the above-described power supply architecture essentially provides N+1+1 redundancy because the system 20 does not need to change out of write-caching mode until the system loses two power supplies 82 on the same side, i.e., two power supplies 82 providing power to the same computing device 32. Along these lines, recall that conventional enclosures typically transition from a write-back caching mode to a write-through caching mode in response to a single power supply fault because the conventional enclosures would lose data to a second fault and thus are now extremely vulnerable. In contrast to conventional enclosures, in response to a single power supply fault, or two power supply failures one on each side, both computing devices 32 of the apparatus 24 can remain fully operational and the apparatus 24 is capable of sustaining at least one additional failure before the apparatus 24 becomes vulnerable. For example, if there is another power supply failure for the same computing device 32 resulting in the immediate shutdown of that computing device 32, the apparatus 24 has one computing device 32 still available that enables the system 20 as a whole to transition to a write-through mode. Accordingly, the apparatus 24 is more tolerant to failures than conventional enclosures which must transition to a cache dumping and write-through mode in response to only a single power supply failure. The apparatus 24 will now be further discussed with reference to FIG. 4.

Figure 4:
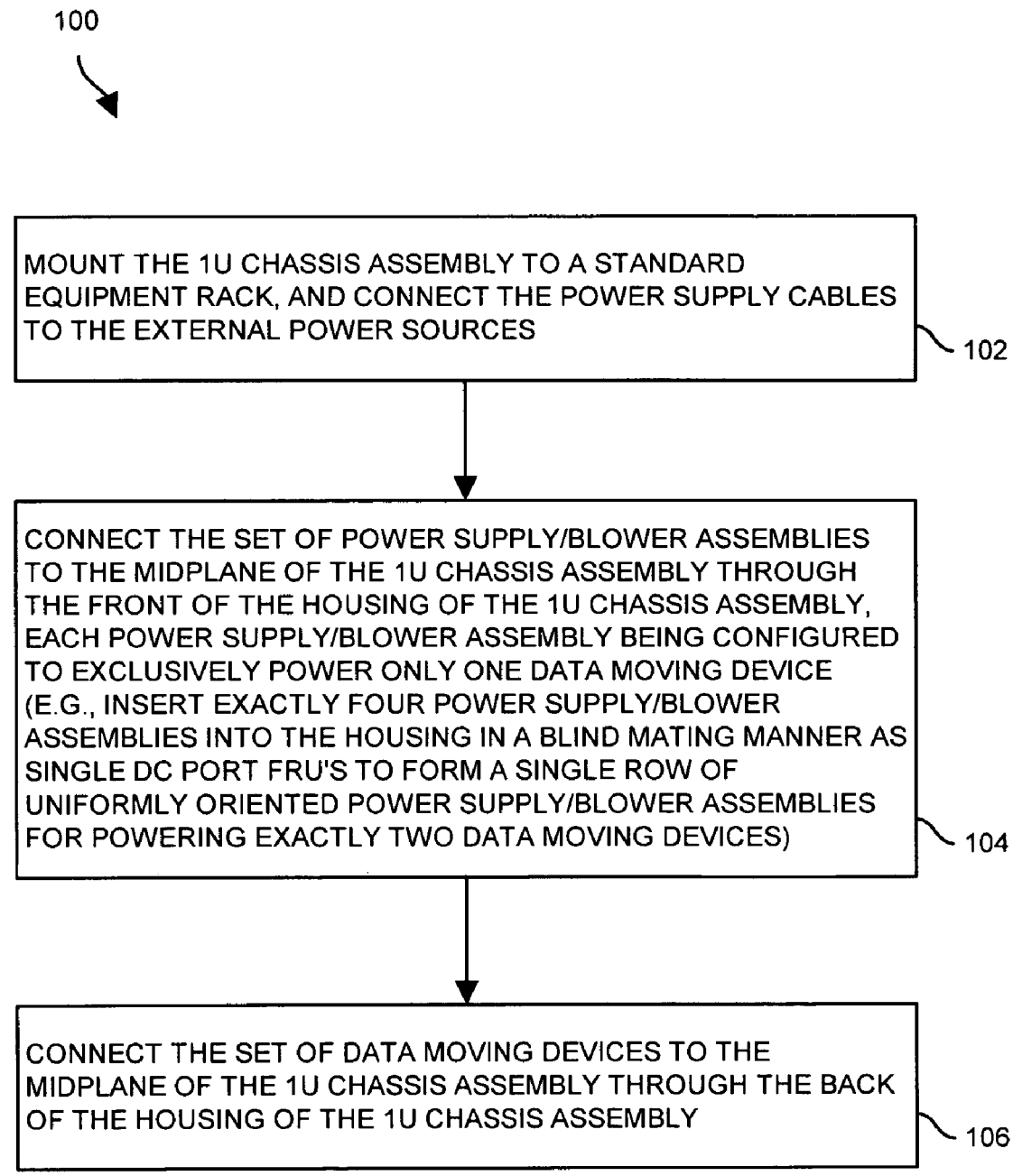
FIG. 4 is a flowchart of a procedure for setting up the redundant computing apparatus of FIG. 1.

FIG. 4 is a flowchart of a procedure 100 which is performed by a user when setting up the apparatus 24. In step 102, the user mounts the chassis assembly 28 to the standard electronic equipment rack 22 (FIG. 1), and connects the power supply cables 64 to the external power sources 74 (FIG. 3). Due to the 1U form factor, the user has the luxury of including additional components within the rack 22 that would not otherwise fit if the form factor were larger.

In step 104, the user connects a set of power supply/blower assemblies 30 to the midplane 36 of the chassis assembly 28 through the front 38 of the housing 34. Here, the user simply inserts the power supply/blower assemblies 30 into the housing 38 in a blind mating manner. Each power supply/blower assembly 30 has a single AC input port and a single DC output port since that assembly 30 is configured to exclusively provide power to only one computing device 32. The power supply/blower assemblies 30 form a single row and all have the same orientations. Moreover, the power supply/blower assemblies 30 are configured as field replaceable units (FRUs) and are hot swappable during operation of the apparatus 24.

In step 106, the user connects the set of computing devices 32 to the midplane 36 of the chassis assembly 28 through a back 42 of the housing 38. Similarly, the computing devices 32 are configured as FRUs, also have the same orientation, and are hot swappable during operation of the apparatus 24.

As described above, an improved redundant computing apparatus includes a 1U chassis 28 and a particular configuration of components within the 1U chassis 28 which enables the components to be less complex as well as enjoy robust field replaceability. Along these lines, power supply/blower assemblies 30 can be simpler and less expensive hot-swappable single-port units which work together to provide redundancy for each computing device 32. Moreover, the computing devices 32 can be high-power, high-speed Intel® Architecture circuits (e.g., IA32 compliant processors and chipsets).

While this invention has been particularly shown and described with references to preferred embodiments thereof, it will be understood by those skilled in the art that various changes in form and details may be made therein without departing from the spirit and scope of the invention as defined by the appended claims.

For example, the apparatus 24 was described above in the context of a data storage system 20 with an adjacent array of disk drives 26 by way of example only. The above-described midplane management and partitioning techniques are well-suited for other applications as well. For instance, the apparatus 24 is capable of being employed in a NAS configuration where the apparatus 24 and disk storage are distributed within a standard network by relatively large distances.

Additionally, it should be understood that the computing devices 32 were described above as being configured to transfer data into and out of a set of disk drives on behalf of external host computers by way of example only. In general, the computing devices can be any type of electronic circuit (e.g., general purpose processing devices, network devices, defense-related electronics, real-time custom circuitry, Microsoft® clusters, etc.) that would benefit by the various power and airflow partitioning techniques and serviceability techniques in a 1U form factor, as described above.

Furthermore, it should be understood that the system 20 was described above as including two computing devices 32 by way of example only. In some arrangements, the system 20 is capable of including a single computing device 32 which benefits from the partitioning scheme, serviceability improvements and redundancies described above. Moreover, such a system 20 is capable of being upgraded in the future (i.e., to multiple computing devices 32) for additional fault tolerance and scaling purposes.

Additionally, it should be understood that the particular power consumption values provided above are by way of example only. The partitioning techniques of the system 20 enable higher power circuit and blower densities than those currently available thus enabling the use of high power computing devices (e.g., dual-dual computing devices 32 having 55 Watt processors and greater). Moreover, such capacities are capable of growing and adjusting as these densities increase in the future.

Furthermore, it should be understood that the system 20 was described above as receiving AC power from two external independent AC sources by way of example only. The system 20 is capable of working in other environments as well such as in a telecommunications environment with external DC power sources using 48 VDC signals. In such a situation, the cables 64 and power supplies 82 are adapted for DC.

Additionally, it should be understood that the midplane 36 was described as carrying power signals but is capable of carrying other types of signals as well. In some arrangements, the midplane 36 includes multiple signal etch runs to redundantly carry data between the computing devices 32 (e.g., Gigabit Ethernet communications, PCI Express link communications, CMI bus communications, etc.). Such modifications and enhancements are intended to belong to various embodiments of the invention.

What is claimed is:

1. An apparatus, comprising:
   a chassis assembly configured to (i) mount to a standard electronic equipment rack and (ii) consume substantially 1U of space in a particular direction within the standard electronic equipment rack, the chassis assembly including a housing and a midplane disposed within the housing;
   a set of power supply/blower assemblies configured to connect to the midplane of the chassis assembly through a front of the housing in a field replaceable manner, each set of power supply/blower assemblies including at least an AC input port and a DC output port;
   a set of computing devices configured to connect to the midplane of the chassis assembly through a back of the housing in a field replaceable manner;
   a set of AC circuit board traces disposed on the midplane and providing an AC power signal between a set of external power sources and the set of power supply/blower assemblies when the set of power supply/blower assemblies connects to the midplane;
   a set of DC circuit board traces disposed on the midplane and providing a DC power signal between the set of power supply/blower assemblies and the set of computing devices when the set of computing devices connects to the midplane; and
   wherein the AC input port of the set of power supply/blower assemblies is electrically coupled to the midplane during use and the DC output port of the set of power supply/blower assemblies is also electrically coupled to the midplane during use in order to provide a set of AC power supply signals from the external power source to the set of power supply/blower assemblies and to provide a set of DC power signals from the set of power supply/blower assemblies to the set of computing devices.

2. An apparatus as in claim 1 wherein each power supply/blower assembly includes:
   a single AC input port and a single DC output port to allow that power supply/blower assembly to provide power exclusively to a respective computing device of the set of computing devices.

3. An apparatus as in claim 2 wherein the set of computing devices includes a first computing device and a second computing device; and wherein the set of power supply/blower assemblies includes:

a first pair of power supply/blower assemblies configured to provide power to the first computing device; and a second pair of power supply/blower assemblies configured to provide power to the second computing device, the first pair of power supply/blower assemblies and the second pair of power supply/blower assemblies forming a single row of power supply/blower assemblies when connecting to the midplane through the front of the housing.

4. An apparatus as in claim 1 wherein the chassis assembly further includes:

a lefthand rail configured to fasten the housing to a lefthand side of the standard electronic equipment rack;

a lefthand power supply cable disposed within the lefthand rail;

a righthand rail configured to fasten the housing to a righthand side of the standard electronic equipment rack; and a righthand power supply cable disposed within the righthand rail, the lefthand rail and righthand rail being adapted to support the housing within the standard electronic equipment rack while the lefthand and righthand power supply cables concurrently carrying the redundant set of AC power signals from the set of external power sources to the set of AC circuit board traces of the midplane along a periphery of the set of computing devices.

5. An apparatus as in claim 1 wherein the set of power supply/blower assemblies include exactly four power supply/blower assemblies which are distributed across the front of the housing along a front portion of the midplane; wherein the set of computing devices includes exactly two computing devices which are distributed across the back of the housing along a back portion of the midplane; wherein each computing device includes two processing units and cache memory; and wherein a single power supply/blower assembly of the four power supply/blower assemblies is configured with a power capacity and a blowing capacity to cool a respective processing unit indefinitely.

6. An apparatus as in claim 5 wherein the two processing units of each computing device are IA32 compliant circuits configured to operate at a wattage of 50 Watts or higher.

7. An apparatus as in claim 6 wherein each computing device has a maximum power rating of 240 Watts; wherein a blower of each power supply/blower assembly has a maximum power rating of 10 Watts; and wherein each power supply/blower assembly is configured with a power supplying capacity of at least 260 Watts to concurrently provide power to at least one computing device and the blowers of two power supply/blower assemblies.

8. An apparatus as in claim 3 wherein the two computing devices are disposed side-by-side at the back of the housing in respective isolated airflow pathways defined by the housing.

9. An apparatus as in claim 6 wherein each of the power supply/blower assemblies is configured to move air from the front of the housing over all of the IA32 compliant circuits and out the back of the 1U housing.

10. An apparatus, comprising:

a chassis assembly configured to (i) mount to a standard electronic equipment rack and (ii) consume substantially 1U of space in a particular direction within the standard electronic equipment rack, the chassis assembly including a housing and a midplane disposed within the housing;

a set of power supply/blower assemblies configured to connect to the midplane of the chassis assembly through a front of the housing in a field replaceable manner; and means for redundant computing, the means for redundant computing including a first and a second means for redundant computing, the first and second means being configured to connect to the midplane of the chassis assembly through a back of the housing in a field replaceable manner and wherein the set of power/supply blower assemblies includes a first pair of power supply/blower assemblies configured to provide power to the first means for redundant computing, and a second pair of power supply/blower assemblies configured to provide power to the second means for redundant computing, the first pair of power supply/blower assemblies and the second pair of power supply/blower assemblies forming a single row of power supply/blower assemblies when connecting to the midplane through the front of the housing.

11. An apparatus as in claim 10 wherein the midplane includes:

means for carrying a set of AC power signals from a set of external power sources to the set of power supply/blower assemblies when the set of power supply/blower assemblies connects to the midplane; and means for carrying a set of DC power signals from the set of power supply/blower assemblies to the set of computing devices when the set of computing devices connects to the midplane.

12. The apparatus of claim 11, wherein each set of power supply/blower assemblies further includes means for connecting the power supply/blower assemblies to both the means for carrying the set of AC power signals and the means for carrying the set of DC power signals.

13. A method for arranging components of an apparatus, the method comprising:

mounting a chassis assembly to a standard electronic equipment rack, the chassis assembly consuming substantially 1U of space in a particular direction within the standard electronic equipment rack, the chassis assembly including a housing and a midplane disposed within the housing;

connecting a set of power supply/blower assemblies to the midplane of the chassis assembly through a front of the housing in a field replaceable manner;

connecting a set of computing devices to the midplane of the chassis assembly through a back of the housing in a field replaceable manner;

wherein connecting the set of power supply/blower assemblies to the midplane includes electrically coupling the set of power supply/blower assemblies to a set of AC circuit board traces disposed on the midplane to provide a set of AC power signals from a set of external power sources through the set of AC circuit board traces to the power supply/blower assemblies and electrically coupling the power supply/blower assemblies to a set of DC circuit board traces disposed on the midplane to provide a set of DC power signals from the set of power supply blower/assemblies to the set of computing devices.

14. A method as in claim 13 wherein each power supply/blower assembly includes a single AC input port and a single DC output port; and wherein electrically coupling the set of power supply/blower assemblies includes:

engaging the single AC input port and the single DC output port of each power supply/blower with the midplane to allow that power supply/blower assembly to provide power exclusively to a respective computing device of the set of computing devices.

15. A method as in claim 13 wherein the chassis assembly further includes:
- a lefthand rail configured to fasten the housing to a lefthand side of the standard electronic equipment rack;
- a lefthand power supply cable disposed within the lefthand rail;
- a righthand rail configured to fasten the housing to a righthand side of the standard electronic equipment rack; and
- a righthand power supply cable disposed within the righthand rail; and wherein the method further includes:
- connecting the lefthand and righthand power supply cables to a set of external power sources to enable the lefthand and righthand power supply cables to carry the set of AC power signals from the set of external power sources to the set of AC circuit board traces of the midplane along a periphery of the set of computing devices.

16. A method as in claim 13 wherein connecting the set of power supply/blower assemblies to the midplane includes:
- forming a single row of exactly four power supply/blower assemblies along the front of the housing.

17. A method as in claim 16 further comprising:
- providing airflow from the front of the housing out the back of the housing through a common airflow pathway over the midplane, and over the set of computing devices.

* * * * *